United States Patent
Moon et al.

(10) Patent No.: US 11,119,619 B2
(45) Date of Patent: Sep. 14, 2021

(54) TOUCH DISPLAY PANEL, MANUFACTURING METHOD THEREOF, DRIVING METHOD THEREOF AND TOUCH DISPLAY DEVICE

(71) Applicant: Yungu (Gu'an) Technology Co., Ltd., Langfang (CN)

(72) Inventors: Kookchul Moon, Jiangsu (CN); Bing Wang, Jiangsu (CN); Peng Xu, Jiangsu (CN); Wonkyu Lee, Jiangsu (CN)

(73) Assignee: Yungu (Gu'an) Technology Co., Ltd., Hebei (CN)

( * ) Notice: Subject to any disclaimer, the term of this patent is extended or adjusted under 35 U.S.C. 154(b) by 0 days.

(21) Appl. No.: 16/913,462

(22) Filed: Jun. 26, 2020

(65) Prior Publication Data

US 2020/0326799 A1    Oct. 15, 2020

Related U.S. Application Data

(63) Continuation-in-part of application No. PCT/CN2018/094953, filed on Jul. 9, 2018.

(30) Foreign Application Priority Data

Jan. 26, 2018    (CN) .......................... 201810076807.1

(51) Int. Cl.
*G06F 3/041*    (2006.01)
*G06F 3/046*    (2006.01)
(Continued)

(52) U.S. Cl.
CPC ............ *G06F 3/046* (2013.01); *G06F 3/0412* (2013.01); *G06F 3/0443* (2019.05);
(Continued)

(58) Field of Classification Search
CPC . G06F 2203/04103; G06F 2203/04111; G06F 3/0412; G06F 3/04166; G06F 3/0443; G06F 3/0448; G06F 3/046; H01L 2227/323; H01L 27/323; H01L 27/3244; H01L 27/3276; H01L 51/0022; H01L 51/0023; H01L 51/56
(Continued)

(56) References Cited

U.S. PATENT DOCUMENTS

2012/0032582 A1    2/2012    Chang et al.
2018/0284505 A1*   10/2018   Ye .......................... G02F 1/1343
(Continued)

FOREIGN PATENT DOCUMENTS

CN    100412917 C    8/2008
CN    101807133 A    8/2010
(Continued)

*Primary Examiner* — Tony O Davis
(74) *Attorney, Agent, or Firm* — BakerHostetler

(57) ABSTRACT

A touch display panel, a manufacturing method thereof, a driving method thereof, and a touch display device are provided. The touch display panel includes a cathode. The cathode includes a plurality of inductive electrodes and a plurality of drive electrodes intersecting with the plurality of inductive electrodes. Each of the inductive electrodes includes a plurality of inductive sub-electrodes connected in sequence, and each of the drive electrodes includes a plurality of drive sub-electrodes connected in sequence.

18 Claims, 4 Drawing Sheets

(51) Int. Cl.
*H01L 27/32* (2006.01)
*H01L 51/00* (2006.01)
*H01L 51/56* (2006.01)
*G06F 3/044* (2006.01)

(52) U.S. Cl.
CPC ........ *G06F 3/0448* (2019.05); *G06F 3/04166* (2019.05); *H01L 27/323* (2013.01); *H01L 27/3244* (2013.01); *H01L 51/0022* (2013.01); *H01L 51/0023* (2013.01); *H01L 51/56* (2013.01); *G06F 2203/04103* (2013.01); *H01L 2227/323* (2013.01)

(58) Field of Classification Search
USPC .................................................. 345/170–178
See application file for complete search history.

(56) References Cited

U.S. PATENT DOCUMENTS

| | | | | |
|---|---|---|---|---|
| 2019/0265827 | A1* | 8/2019 | Liu | G06F 3/0412 |
| 2020/0012388 | A1* | 1/2020 | Zhong | G06F 3/0446 |
| 2020/0285347 | A1* | 9/2020 | Ma | G09G 3/36 |
| 2020/0326799 | A1* | 10/2020 | Moon | G06F 3/0412 |
| 2020/0341590 | A1* | 10/2020 | Li | H01L 51/5228 |

FOREIGN PATENT DOCUMENTS

| | | |
|---|---|---|
| CN | 103838430 A | 6/2014 |
| CN | 104409467 A | 3/2015 |
| CN | 104752466 A | 7/2015 |
| CN | 104991683 A | 10/2015 |
| CN | 205353991 U | 6/2016 |
| CN | 105814529 A | 7/2016 |
| CN | 106206656 A | 12/2016 |
| CN | 106653813 A | 5/2017 |
| CN | 107506078 A | 12/2017 |
| CN | 108255347 A | 7/2018 |
| TW | M495570 U | 2/2015 |

* cited by examiner

TOUCH DISPLAY PANEL, MANUFACTURING METHOD THEREOF, DRIVING METHOD THEREOF AND TOUCH DISPLAY DEVICE

CROSS REFERENCE TO RELATED APPLICATION

This application is a continuation of International Application No. PCT/CN2018/094953, filed on Jul. 9, 2018, which is based upon and claims priority to Chinese Patent Application No. 201810076807.1, filed on Jan. 9, 2018, the entire contents of which are incorporated herein by reference.

TECHNICAL FIELD

The application relates to a display technical field, and more particularly to a touch display panel, a manufacturing method thereof, a driving method thereof and a touch display device.

BACKGROUND

The touch display panel integrates a touch screen with a flat display panel to enable a flat display panel with a touch function. Generally, the touch display panel may provide a human-computer interactive interface, and allows input through fingers, a stylus, etc., which is more direct and more humanized in use. With the development of display technologies, touch display panels are increasingly used in various display devices.

The touch display panel generally includes an inductive electrode and a drive electrode. When the inductive electrode and the drive electrode are manufactured, they can generally be manufactured by a mask process.

However, in the actual manufacturing process, since a plurality of film layers are arranged between the inductive electrode and the drive electrode, a plurality of mask processes are required to manufacture the inductive electrode and the drive electrode. In this way, the number of processes in the plurality of mask processes is relatively large, and the manufacturing time is relatively long, which results in a complicated manufacturing method of the existing touch display panel.

SUMMARY

A touch display panel, a manufacturing method thereof, a driving method thereof and a touch display device are provided.

A touch display panel, comprising a cathode, wherein

The cathode comprises a plurality of inductive electrodes and a plurality of drive electrodes intersecting with the plurality of inductive electrodes;

Each of the inductive electrodes comprises a plurality of inductive sub-electrodes connected in sequence, and each of the drive electrodes comprises a plurality of drive sub-electrodes connected in sequence.

Each of the inductive sub-electrodes has a strip-shaped grid shape, and each of the drive sub-electrodes has a strip-shaped grid shape, or Each of the inductive sub-electrodes has a diamond-shaped grid shape, and each of the drive sub-electrodes has a diamond-shaped grid shape.

Optionally, the touch display panel further includes an anode and an organic light emitting layer, wherein the organic light emitting layer covers the anode, and the cathode covers the organic light emitting layer, The organic light emitting layer comprises a plurality of contact holes, and the cathode is connected to the anode via the plurality of contact holes.

Optionally, two adjacent inductive sub-electrodes are connected via the anode between the corresponding contact holes, and two adjacent drive sub-electrodes are connected via the anode between the corresponding contact holes.

Optionally, two adjacent inductive sub-electrodes are connected via the anode between the corresponding contact holes, and two adjacent drive sub-electrodes are connected via the cathode between the two adjacent drive sub-electrodes.

Optionally, two adjacent inductive sub-electrodes are connected via the cathode between the two adjacent inductive sub-electrodes, and two adjacent drive sub-electrodes are connected via the anode between the corresponding contact holes.

Optionally, the cathode is covered by a conductive material at positions of the plurality of the contact holes.

Optionally, the conductive material has a resistivity lower than that of the cathode and the anode.

Optionally, the conductive material is silver paste.

Optionally, the inductive sub-electrodes and the drive sub-electrodes intersect with each other and are not in contact with each other, the inductive sub-electrodes are connected to a plurality of pixels, and the drive sub-electrode are connected to a plurality of pixels.

Optionally, a manufacturing method for a touch display panel, including:

Performing a laser radiation on a cathode contained in the touch display panel to obtain a plurality of inductive electrodes and a plurality of drive electrodes intersecting with the plurality of inductive electrodes, each of the inductive electrodes comprises a plurality of inductive sub-electrodes connected in sequence, each of the drive electrodes comprises a plurality of drive sub-electrodes connected in sequence.

Optionally, before performing laser radiation on the cathode, the method further comprises: forming an anode on a substrate; depositing an organic light emitting layer on the anode performing a laser drilling on the organic light emitting layer to form a plurality of contact holes;

depositing a cathode on the organic light emitting layer, and connecting the cathode to the anode at the contact holes.

Optionally, performing the laser drilling on the organic light emitting layer to form the contact holes comprises: predetermining positions where the contact holes to be formed according to an electrode pattern to be manufactured, and then penetrating the organic light emitting layer at the determined positions to form the contact holes at a penetration positions by laser drilling.

Optionally, performing the laser radiation on the cathode contained in the touch display panel to obtain the plurality of inductive electrodes and the plurality of drive electrodes, comprising: performing the laser radiation on the cathode, every two contact holes are made in a group in a connecting direction of the inductive sub-electrodes, and the laser radiation is performed at two positions of a cathode portion between each group of contact holes; a cathode portion between the two positions is a drive sub-electrode, and the cathode portion between each group of contact holes is an inductive sub-electrode.

Optionally, performing the laser radiation on the cathode contained in the touch display panel to obtain the plurality of inductive electrodes and the plurality of drive electrodes, comprising: performing the laser radiation at one position of a cathode portion between each group of contact holes, every two contact holes are made in a group in a connecting direction of the drive sub-electrodes, and a cathode portion between two adjacent groups of contact holes is a drive sub-electrode.

Optionally, after depositing the cathode on the organic light emitting layer, the method further comprises:

applying at the contact holes of the cathode a conductive material having a resistivity lower than that of the anode and the cathode.

Optionally, the method further comprises: printing silver paste at the contact holes of the cathode.

A driving method for a touch display panel, including: during a displaying and driving phase, supplying a displaying and driving signal to a plurality of inductive electrodes and a plurality of drive electrodes included in the cathode; during a touching and driving phase, supplying a touching and driving signal to the drive electrode, and detecting a touch inductive signal of the inductive electrode; cathode comprises a plurality of inductive electrodes and a plurality of drive electrodes intersecting with the plurality of inductive electrodes; each of the inductive electrodes comprises a plurality of inductive sub-electrodes connected in sequence, and each of the drive electrodes comprises a plurality of drive sub-electrodes connected in sequence.

A touch display device, including the touch display panel mentioned above.

The following technical effects can be achieved by at least one of the technical solutions adopted by the embodiment of the application:

The touch display panel provided in the embodiment of the application includes a cathode, the cathode includes a plurality of inductive electrodes and a plurality of drive electrodes intersecting with the plurality of inductive electrodes. Each of the inductive electrodes includes a plurality of inductive sub-electrodes connected in sequence. Each of the drive electrodes includes a plurality of drive sub-electrodes connected in sequence. In this way, since the cathode of the touch display panel includes the inductive electrode and the drive electrode, the inductive electrode and the drive electrode can be obtained from the cathode, the inductive electrode and the drive electrode including a plurality of film layers can be manufactured separately without the mask process, thereby effectively simplifying the process.

In addition, since the inductive electrodes and the drive electrodes of the touch display panel are both included in the cathode, the structure of the touch display panel can be simpler, and the integration of touch and display in the touch display panel can be easy to implement.

BRIEF DESCRIPTION OF THE DRAWINGS

In order to more clearly illustrate the embodiment of the application or the technical solutions in the prior art, the drawings to be used in the embodiments or the description of the prior art will be briefly described below. Obviously, the drawings in the following description are only some embodiment of the application, and other drawings may be obtained according to the structures shown in the drawings by a person skilled in the art without paying any creative work.

The implementation, functional features and advantages of the application will be further described with reference to the accompanying drawings.

DETAILED DESCRIPTION

In order to solve the above problems, the embodiments of the application provides a touch display panel, a manufacturing method thereof, a driving method thereof, and a touch display device. The touch display panel includes a cathode, and the cathode includes a plurality of inductive electrodes and a plurality of drive electrodes intersecting with the plurality of inductive electrodes. Each of the inductive electrodes includes a plurality of inductive sub-electrodes connected in sequence. Each of the drive electrodes includes a plurality of drive sub-electrodes connected in sequence. In this way, since the cathode of the touch display panel includes the inductive electrode and the drive electrode, the inductive electrode and the drive electrode can be obtained from the cathode, the inductive electrode and the drive electrode including a plurality of film layers can be manufactured without the mask process, thereby effectively simplifying the process.

In addition, since the inductive electrodes and the drive electrodes of the touch display panel are both included in the cathode, the structure of the touch display panel can be simpler, and the integration of touch and display in the touch display panel can be easy to implement.

The technical solutions of the application are clearly and completely described below in conjunction with the specific embodiments of the application and the corresponding drawings. It is apparent that the described embodiments are only a part of the embodiments of the application, and not all of the embodiments. All other embodiments obtained by a person of ordinary skill in the art based on the embodiments of the application without paying creative work should fall into the protection scope of the application.

The touch display panel provided by the embodiment of the present invention may be an in-cell touch display panel, and the touch electrodes may be integrated in the cathode of the touch display panel.

In the embodiment of the application, the touch electrode may be manufactured by the laser process replacing the traditional mask process. On the one hand, the manufacturing process of the touch display panel can be effectively simplified, and on the other hand, the damage to the touch display panel by the water vapor and the like in the mask process can be avoided.

The technical solution provided by the embodiment of the application will be described in detail below with reference to the accompanying drawings.

Figure 1:
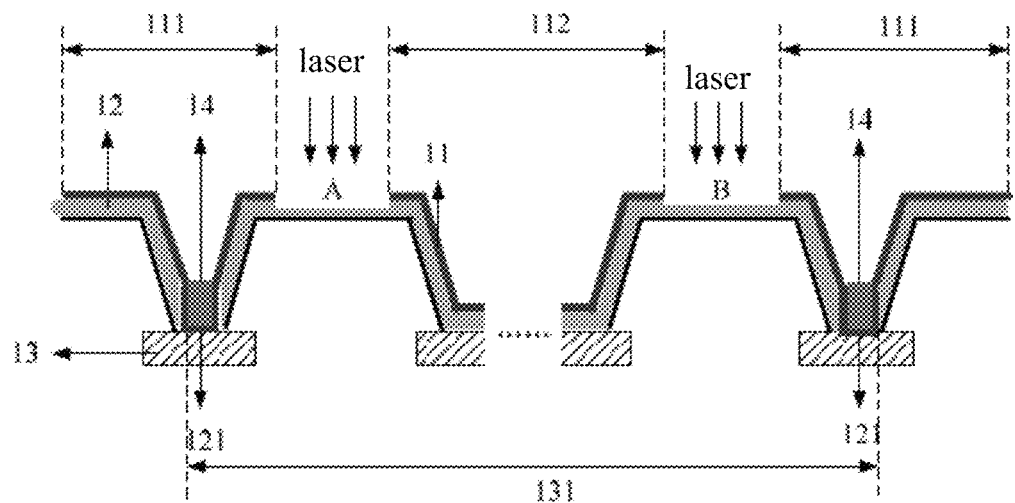
FIG. 1 is a side view of a touch display panel according to an embodiment of the application.

FIG. 1 is a side view of a touch display panel according to an embodiment of the application.

In FIG. 1, the touch display panel may include a cathode 11 which includes a plurality of inductive electrodes and a plurality of drive electrodes. The plurality of inductive electrodes and the plurality of drive electrodes intersect with each other without being in direct contact with each other. Each of the inductive electrodes may include a plurality of inductive sub-electrodes 111 connected in sequence, and each of the drive electrodes may include a plurality of drive sub-electrodes 112 connected in sequence.

The ellipsis shown in FIG. 1 can be used to represent a plurality of pixels, that is, the drive sub-electrode 112 can be connected to a plurality of pixels. In addition, the inductive sub-electrode 111 can also be connected to a plurality of pixels, which is not shown in FIG. 1. The plurality of inductive sub-electrodes 111 and the plurality of drive sub-electrodes 112 can be obtained by patterning the cathode 11 by laser radiation.

As shown in FIG. 1, laser radiation can be conducted at the position A and the position B of the cathode 11. After the laser radiation, the cathode 11 can be disconnected at the position A and the position B. Specifically, the position A and the position B are located above a pixel definition layer to form an inductive sub-electrode 111 and a drive sub-electrode 112. The inductive sub-electrode 111 and the drive sub-electrode 112 intersect with each other.

In the embodiment of the application, each of the inductive sub-electrodes 111 and each of the drive sub-electrodes may have a stripe grid shape or a diamond grid shape. In other embodiments, each of the inductive sub-electrodes 111 and each of the drive sub-electrodes may also have rectangular grid shape or other shapes, which are not specifically limited herein.

The touch display panel shown in FIG. 1 may further include an organic light emitting layer 12 and an anode 13. The organic light emitting layer 12 may cover the anode 13, and the cathode 11 may cover the organic light emitting layer 12. A plurality of contact holes 121 may also be included in the organic light emitting layer 12, and the cathode 11 may be connected to the anode 13 at the position of the contact holes 121.

The plurality of contact holes 121 may also be obtained by laser drilling. Specifically, a plurality of punched positions where the organic light emitting layer covers the anode 13 may be laser drilling and the organic light emitting layer 12 is penetrated at the punched position, to form a plurality of contact holes 121.

After the plurality of contact holes 121 are formed, since the organic light emitting layer 12 is penetrated at the position of the contact hole 121, the cathode 11 can be connected to the anode 13 at the positions of the plurality of contact holes 121, when the organic light emitting layer 12 is covered by the cathode 11.

In FIG. 1, to each of the inductive electrodes, the two adjacent inductive sub-electrodes 111 in the plurality of inductive sub-electrodes 111 connected in sequence are connected to each other by the anode 13 between the corresponding contact holes 121 (i.e., two contact holes 121 as shown in FIG. 1). To each of the drive electrodes, the two adjacent drive sub-electrodes 112 in the plurality of drive sub-electrodes 112 connected in sequence are connected by the anode 13 between the corresponding contact holes 121 (not shown in FIG. 1).

Figure 2:
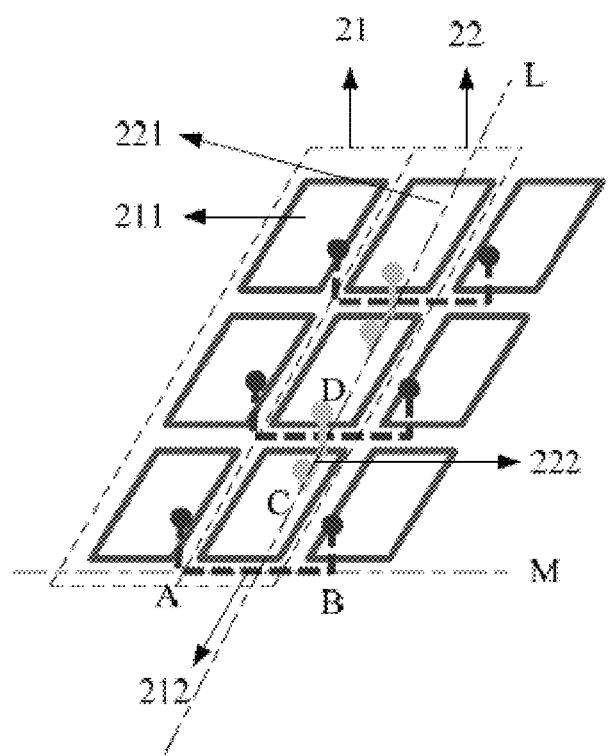
FIG. 2 is a schematic structural view of a touch electrode according to an embodiment of the application.

FIG. 2 is a schematic structural view of a touch electrode according to an embodiment of the application. FIG. 1 is a side view of FIG. 2 along the dashed line M. In FIG. 2, the touch electrode may include a plurality of inductive electrodes 21 and a plurality of drive electrodes 22. The inductive electrodes 21 may include a plurality of inductive sub-electrodes 211 (corresponding to the inductive sub-electrodes 111 shown in FIG. 1), and the drive electrodes 22 may include a plurality of drive sub-electrodes 221 (corresponding to the drive sub-electrodes 112 shown in FIG. 1).

The two adjacent inductive sub-electrodes 211 in FIG. 2 are connected by a bridge 212. The bridge 212 may correspond to the anode area 131 shown in FIG. 1, and the two ends A and B of the bridge 212 may correspond to the contact holes 121 at both ends of the anode area 131 shown in FIG. 1.

Figure 3:
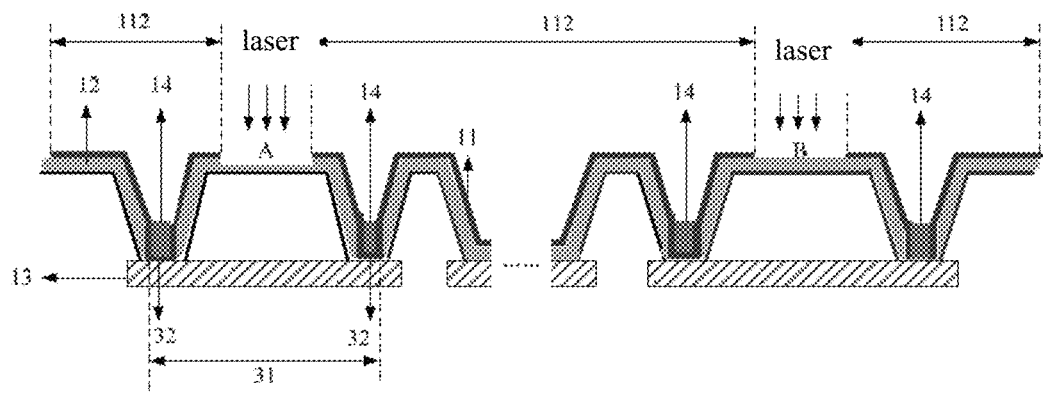
FIG. 3 is a side view of another touch display panel according to an embodiment of the application.

The two adjacent drive sub-electrodes 221 in FIG. 2 are connected by a bridge 222. In conjunction with FIG. 3, FIG. 3 is a side view of FIG. 2 taken along the broken line L. The bridge 222 shown in FIG. 2 may correspond to the anode area 31 shown in FIG. 3. The two end points C and D of the bridge 222 may correspond to the contact holes 32 at both ends of the anode area 31 as shown in FIG. 3. The meanings of other reference signs in FIG. 3 can be seen in FIG. 1.

It should be noted that, in addition to the connection structure of the inductive sub-electrode 111 and the drive sub-electrode 112 shown in FIG. 2, in the touch display panel provided by the embodiment of the present invention, two adjacent inductive sub-electrodes may be connected by the anodes between the corresponding contact holes. The two adjacent drive sub-electrodes are connected by the cathodes formed therebetween.

Specifically, two adjacent inductive sub-electrodes may be connected by the anodes between the corresponding contact holes.

Two adjacent drive sub-electrodes are connected by a cathode formed therebetween. In particular, when laser radiation is applied to the cathode to manufacture a drive electrode, a position of the drive sub-electrode in the cathode can be predetermined. Laser radiation may be applied to a portion of the cathode between two drive sub-electrodes. Meanwhile, a portion of the cathode is retained to form a first retaining portion, and the first retaining portion of the cathode can be used to connect two adjacent drive sub-electrodes. In this way, two adjacent drive sub-electrodes can be connected by the cathode formed therebetween.

Figure 4:
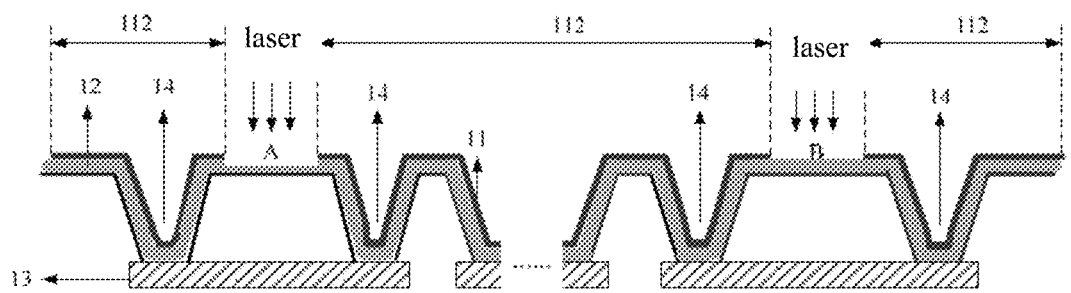
FIG. 4 is a side view of still another touch display panel according to an embodiment of the application.

As shown in FIG. 4, compared with FIG. 3, there are no contact holes at the position 14 in FIG. 4, and laser radiation may be performed at two positions A and B when laser radiation is applied to the cathode 11 shown in FIG. 4. And a portion of the cathode between the two adjacent drive sub-electrodes 112 may be retained, thus the two adjacent drive sub-electrodes 112 are connected by the cathode formed therebetween.

In addition, in the touch display panel provided by the embodiment of the application, the two adjacent inductive sub-electrodes may be connected by a cathode formed therebetween, and the two adjacent drive sub-electrodes may be connected by an anode between the contact holes.

The two adjacent drive sub-electrodes may be connected by the anodes between the corresponding contact holes.

Two adjacent inductive sub-electrodes are connected by a cathode formed therebetween. In particular, the position of the inductive sub-electrode in the cathode can be predetermined, and laser radiation may be applied to a portion of the cathode between two inductive sub-electrodes. Meanwhile, a portion of the cathode is retained to form a second retaining portion, and the second retaining portion of the cathode can be used to connect two adjacent inductive sub-electrodes. In this way, the two adjacent inductive sub-electrodes can be connected by the cathode formed therebetween.

In the embodiment of the application, a conductive material 14 may also be printed on the cathode 11 in the touch display panel shown in FIG. 1. Specifically, the conductive material 14 can be printed on the cathode 11 at a position of the contact hole 121. The resistivity of the conductive material may be lower than the resistivity of the cathode 11 and the anode 13, so that impedance between the cathode 11 and the anode 13 at the contact hole 121 can be effectively reduced.

Preferably, the conductive material may be silver paste with better conductivity, or other viscous (printable) conductive material, which is not specifically limited herein.

The touch display panel provided by the embodiment of the application includes a cathode, and the cathode includes a plurality of inductive electrodes and a plurality of drive electrodes intersecting with the plurality of inductive electrodes. Each of the inductive electrodes includes a plurality of inductive sub-electrodes connected in sequence. Each of the drive electrodes includes a plurality of drive sub-electrodes connected in sequence. In this way, since the cathode of the touch display panel includes the inductive electrode and the drive electrode, the inductive electrode and the drive electrode can be manufactured in the cathode. the inductive electrodes and the drive electrodes including a plurality of film layers may not need to be separately manufactured by a mask process, thereby effectively simplifying the process.

In addition, since the inductive electrodes and the drive electrodes of the touch display panel are both included in the cathode, the structure of the touch display panel is simpler, and the integration of touch and display in the touch display panel can be easy to implement.

The embodiment of the present invention provides a manufacturing method for a touch display panel which may be used to manufacture the touch display panel according to the above Embodiment one. The manufacturing method may include:

Laser radiation is applied to the cathode contained in the touch display panel to obtain a plurality of inductive electrodes and a plurality of drive electrodes. And the plurality of inductive electrodes and the plurality of drive electrodes intersect with each other.

In the embodiment of the application, when the inductive electrode and the drive electrode in the touch display panel are manufactured, the cathode in the touch display panel may be subjected to laser radiation. Specifically, some areas of the cathode may be broken by laser radiation to form a plurality of electrode patterns, thereby manufacturing a plurality of inductive electrodes and a plurality of drive electrodes. The plurality of inductive electrodes and the plurality of drive electrodes may intersect with each other.

In the embodiment of the application, before performing laser radiation on the cathode, the method further includes:

Forming an anode on the substrate;

Depositing an organic light emitting layer on the anode;

Performing laser drilling on the organic light emitting layer to form a contact hole;

Depositing a cathode on the organic light emitting layer, the cathode being connected to the anode at the contact hole.

Specifically, the substrate may be a glass substrate, and the anode may be directly formed on the substrate, and then the organic light emitting layer may be deposited on the anode. The organic light emitting layer may be an OLED organic light emitting layer.

After the organic light emitting layer is formed by depositing, the organic light emitting layer may be subject to laser drilling to form the contact hole. The contact hole may be used to connect the anode to the cathode to be manufactured. Specifically, the position where the contact hole needs to be formed may be predetermined according to an electrode pattern to be manufactured, and then the organic light emitting layer at the determined position, (the penetration position can be called), is penetrated by laser drilling to form the contact hole at the penetration position.

After the contact hole is obtained by laser drilling, a cathode may be deposited on the organic light emitting layer such that the cathode may be in contact with the anode at the location of the contact hole.

After the cathode is formed by depositing, a conductive material having a resistivity lower than that of the cathode and the anode, may be formed at the contact hole of the cathode to reduce an impedance between the cathode and the anode at the contact hole. Preferably, the conductive material may be silver paste having good conductivity, that is, silver paste may be printed at the contact hole of the cathode.

It should be understood that the conductive material may also be other viscous conductive materials, which will not be exemplified one by one herein.

FIG. 5 to FIG. 10 are schematic views showing a manufacturing method for a touch display panel according to an embodiment of the application.

Figure 5:
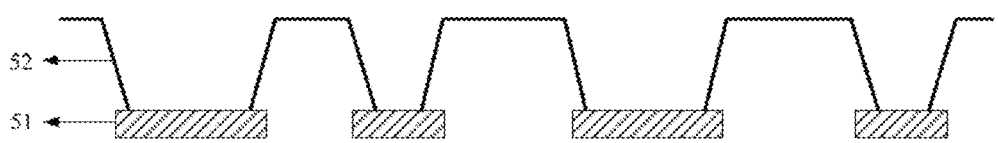
FIG. 5 to FIG. 10 are schematic views of a manufacturing method of a touch display panel according to an embodiment of the application.

Step one: as shown in FIG. 5, the anode 51 can be formed by an array process, the mark 52 shown in FIG. 5 may be referred to a pixel defining layer, and pixels may be manufactured in the pixel defining layer 52.

Figure 6:
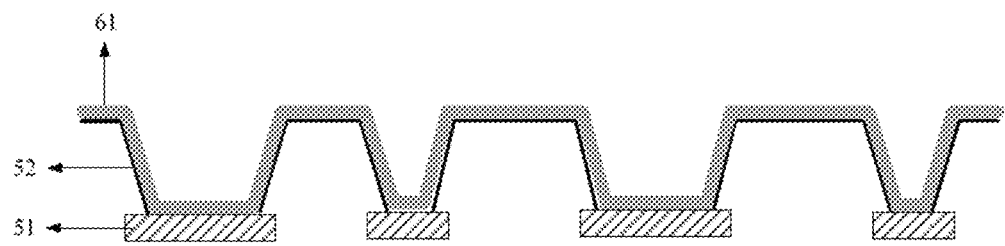

Step two: as shown in FIG. 6, an organic light emitting layer 61 may be manufactured on the anode 51. The organic light emitting layer 61 may be an OLED organic light emitting layer.

Figure 7:
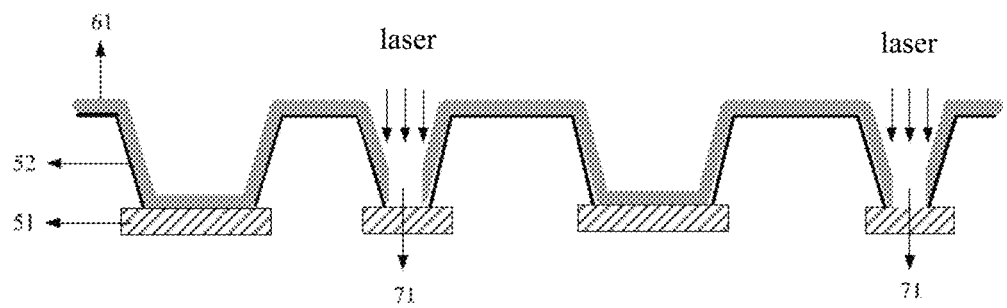

Step three: as shown in FIG. 7, laser drilling may be performed on the organic light emitting layer 61 at determined positions to obtain two contact holes 71.

Figure 8:
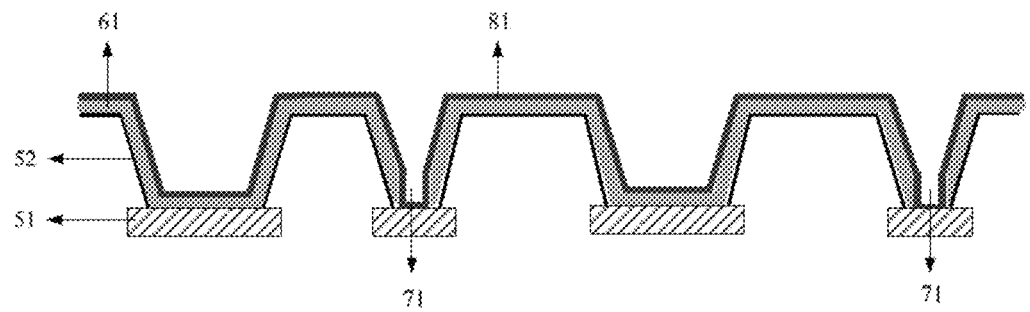

Step four: as shown in FIG. 8, a cathode 81 may be deposited on the organic light emitting layer 61. The cathode 81 may be connected to the anode 51 formed at the position of the two contact holes 71.

Figure 9:
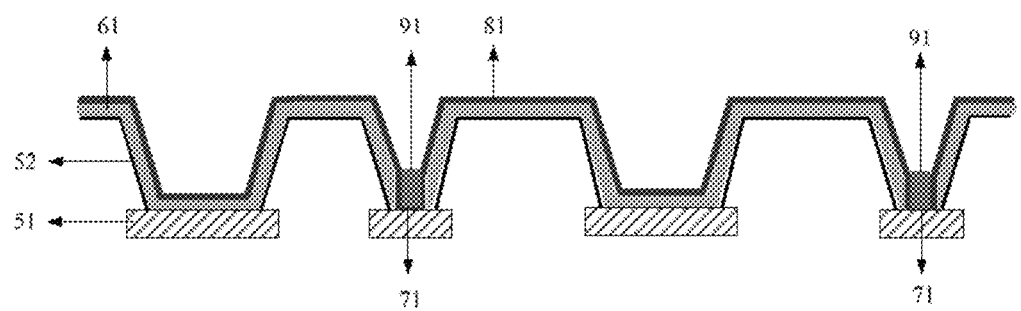

Step five: as shown in FIG. 9, the silver paste 91 may be printed at the position of the two contact holes 71 of the cathode 81 to lower the impedance between the cathode 81 and the anode 51.

Figure 10:
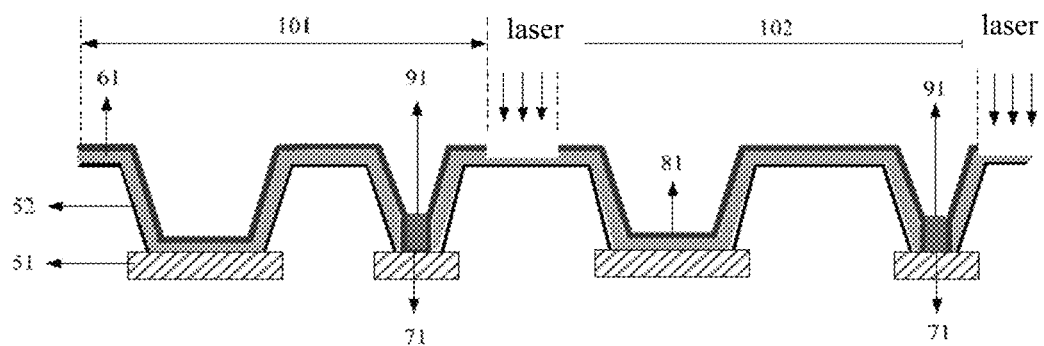

Step six: as shown in FIG. 10, after determining the position at which the laser radiation is required, laser radiation may be applied to the cathode 81 at a determined position to form the inductive sub-electrode 101 and the drive sub-electrode 102. The inductive sub-electrode 101 and the drive sub-electrodes 102 intersect with each other and are not in contact with each other.

In the embodiment of the application, based on the steps shown in FIG. 5 to FIG. 10, a plurality of inductive electrodes and a plurality of drive electrodes may be manufactured. The plurality of inductive electrodes and the plurality of drive electrodes intersect with each other, and are not in contact with each other. Each of the inductive electrodes may include a plurality of inductive sub-electrodes connected in sequence, and each of the drive electrodes may include a plurality of drive sub-electrodes connected in sequence.

It should be noted that, in the touch display panel provided by the embodiment of the present application, the connection structure between the inductive sub-electrodes and the connection structure between the drive sub-electrodes may include at least following three types:

A first structure: the two adjacent inductive sub-electrodes are connected by the anode between the corresponding contact holes, and the two adjacent drive sub-electrodes are connected by the anode between the corresponding contact holes;

A second structure: the two adjacent inductive sub-electrodes are connected by the anode between the corresponding contact holes, and two adjacent drive sub-electrodes are connected by a cathode therebetween;

A third structure: two adjacent inductive sub-electrodes are connected by a cathode between the two, and the two adjacent drive sub-electrodes are connected by the anode between the corresponding contact holes.

When the touch electrode of the first structure is manufactured, the method may specifically include:

Since the anode may be served as a bridge between two adjacent inductive sub-electrodes, or can be served as a bridge between two adjacent drive sub-electrodes, thus:

The position of the contact holes corresponding to each of the inductive sub-electrodes and each of the drive sub-electrodes may be determined according to a predetermined connection structure between the inductive sub-electrodes and a predetermined connection structure between the drive sub-electrodes (each inductive sub-electrode may correspond to two contact holes which may be located at two ends of the inductive sub-electrodes; each of the drive sub-electrodes may correspond to two contact holes, and two contact holes may be located at both ends of the drive sub-electrode), and the contact hole may be obtained by laser-drilling at a predetermined positions.

When laser radiation is applied to the cathode, every two contact holes may be made in a group in the connecting direction of the inductive sub-electrodes, and laser radiation may be performed at two positions of the cathode portion between each group of contact holes. The cathode portion between the two positions is a drive sub-electrode, and the cathode portion between each group of contact holes is an inductive sub-electrode. In the connecting direction of the drive sub-electrodes, every two contact holes may also be made in a group. Laser radiation may be performed at one position of the cathode portion between each group of contact holes, and the cathode portion between the two adjacent groups of contact holes is a drive sub-electrode.

In this way, the two adjacent inductive sub-electrodes are connected by the anode between the corresponding contact holes, and the two adjacent drive sub-electrodes are connected by the anode between the corresponding contact holes.

The touch electrode shown in FIG. 2 may be manufactured according to the above method. In FIG. 2, the two adjacent inductive sub-electrodes are connected by the anode between the corresponding contact holes, and the two adjacent drive sub-electrodes are connected by the anode between the corresponding contact holes.

It should be noted that the drive sub-electrode may be manufactured according to the manufacturing method for the inductive sub-electrode described above, and the inductive sub-electrode may be manufactured according to the manufacturing method for the drive sub-electrode, so that the touch electrode of the first structure may also be obtained. The electrode structure of the touch electrode is contrary to the electrode structure shown in FIG. 2, that is, the inductive sub-electrode shown in FIG. 2 is a drive sub-electrode of the touch electrode, and the drive sub-electrode shown in FIG. 2 is the inductive sub-electrode of the touch electrode.

When the touch electrode of the second structure is manufactured, the method may specifically include:

Since the anode can be served as a bridge between two adjacent inductive sub-electrodes, and the cathode can be served as a bridge between two adjacent drive sub-electrodes.

When the inductive sub-electrode is manufactured, it may be manufactured according to the manufacturing method described in the first structure above;

When the inductive sub-electrode is manufactured, it is not necessary to manufacture a contact hole corresponding to the drive sub-electrode, and laser radiation may be performed on a portion of the cathode between the two drive sub-electrodes after determining the position of the drive sub-electrode in the cathode. Meanwhile, a portion of the cathode is retained to form the first retaining portion, the first retaining portion of the cathode may be used for connecting two adjacent drive sub-electrodes.

In this way, the two adjacent inductive sub-electrodes can be connected by the anode formed between the corresponding contact holes, and two adjacent drive sub-electrodes can be connected by a cathode formed therebetween.

When the touch electrode of the third structure is manufactured, the method may specifically include:

Since the cathode may be served as a bridge between two adjacent inductive sub-electrodes, the anode may also be served as a bridge between two adjacent drive sub-electrodes.

When manufacturing the inductive sub-electrode, it may be manufactured according to the manufacturing method for manufacturing the drive sub-electrode described above;

When manufacturing the drive sub-electrode, it may be manufactured according to the manufacturing method for the manufacturing the drive sub-electrode described above.

In this way, two adjacent inductive sub-electrodes are connected by a cathode formed therebetween, and the two adjacent drive sub-electrodes are connected by the anode between the corresponding contact holes.

In the manufacturing method of the touch display panel provided by the embodiment of the present invention, the inductive electrode and the drive electrode can be manufactured by applying laser radiation to the cathode of the touch display panel when the touch display panel is manufactured. The inductive electrode and the drive electrode may be manufactured by performing a laser radiation process on the cathode, the manufacturing process of the touch display panel can be simplified, and the manufacturing method can be simpler.

The embodiment of the present application provides a driving method for a touch display panel, which may be used to drive the touch display panel described in the above Embodiment.

Specifically, one driving cycle of the driving method may include: a displaying and driving phase and a touching and driving phase, Here:

During the displaying and driving phase, a displaying and driving signal may be supplied to a plurality of inductive electrodes and a plurality of drive electrodes in the cathode, so that a display function of the cathode can be easily realized in the displaying and driving phase.

During touching and driving phase, a touching and driving signal can be provided to the drive electrode, and a touch inductive signal of the inductive electrode may be detected, so that a touch function of the cathode can be easily realized in the touching and driving phase.

It should be noted that, in the touching and driving phase, the touching and driving signal is not required to be provided to the inductive electrode, but the touch and inductive signal sensed by the inductive electrode needs to be detected, so that the touch function of the touch display panel can be achieved in the touching and driving phase.

The embodiment of the application also provides a touch display device which may include the touch display panel recorded in Embodiment one.

It will be apparent to a person skilled in the art that although preferred embodiment of the application have been described, the other modifications and changes may be made to the preferred embodiments as long as a person skilled in the art knows basic innovative concepts. Therefore, the appended claims are intended to be interpreted as including the preferred embodiments and the modifications and changes which fall into the protection scope of the application.

It will be apparent to a person skilled in the art that various modifications and changes may be made to the application without departing from the scope of the application. Thus, the application is intended to cover the modifications and changes of the application if the modifications and changes made to the application fall into the protection scope of the claims and the equivalent technology of the application.

What is claimed is:

1. A touch display panel, comprising a cathode, wherein, the cathode comprises a plurality of inductive electrodes and a plurality of drive electrodes intersecting with the plurality of inductive electrodes;
each of the inductive electrodes comprises a plurality of inductive sub-electrodes connected in sequence, and each of the drive electrodes comprises a plurality of drive sub-electrodes connected in sequence;
the touch display panel further comprising an anode and an organic light emitting layer, wherein the organic light emitting layer covers the anode, and the cathode covers the organic light emitting layer; and
the organic light emitting layer comprises a plurality of contact holes, and the cathode is connected to the anode via the plurality of contact holes.

2. The touch display panel according to claim 1, wherein, each of the inductive sub-electrodes has a strip-shaped grid shape, and each of the drive sub-electrodes has a strip-shaped grid shape, or
each of the inductive sub-electrodes has a diamond-shaped grid shape, and each of the drive sub-electrodes has a diamond-shaped grid shape.

3. The touch display panel according to claim 1, wherein, two adjacent inductive sub-electrodes are connected via the anode between the corresponding contact holes, and two adjacent drive sub-electrodes are connected via the anode between the corresponding contact holes.

4. The touch display panel according to claim 1, wherein, two adjacent inductive sub-electrodes are connected via the anode between the corresponding contact holes, and two adjacent drive sub-electrodes are connected via the cathode between the two adjacent drive sub-electrodes.

5. The touch display panel according to claim 1, wherein, two adjacent inductive sub-electrodes are connected via the cathode between the two adjacent inductive sub-electrodes, and two adjacent drive sub-electrodes are connected via the anode between the corresponding contact holes.

6. The touch display panel according to claim 1, wherein, the cathode is covered by a conductive material at positions of the plurality of contact holes.

7. The touch display panel according to claim 6, wherein, the conductive material has a resistivity lower than that of the cathode and the anode.

8. The touch display panel according to claim 6, wherein, the conductive material is silver paste.

9. The touch display panel according to claim 1 wherein the inductive sub-electrodes and the drive sub-electrodes intersect with each other and are not in contact with each other, the inductive sub-electrodes are connected to a plurality of pixels, and the drive sub-electrodes are connected to a plurality of pixels.

10. A driving method for the touch display panel according to claim 1, the method comprising:
during a displaying and driving phase, supplying a displaying and driving signal to a plurality of inductive electrodes and a plurality of drive electrodes contained in the cathode; and
during a touching and driving phase, supplying a touching and driving signal to the drive electrode, and detecting a touch inductive signal of the inductive electrode; wherein,
the cathode comprises a plurality of inductive electrodes and a plurality of drive electrodes intersecting with the plurality of inductive electrodes;
each of the inductive electrodes comprises a plurality of inductive sub-electrodes connected in sequence, and each of the drive electrodes comprises a plurality of drive sub-electrodes connected in sequence.

11. A touch display device, comprising the touch display panel according to claim 1.

12. The touch display panel according to claim 1, wherein,
each of the inductive sub-electrodes has a strip-shaped grid shape, and each of the drive sub-electrodes has a strip-shaped grid shape, or
each of the inductive sub-electrodes has a diamond-shaped grid shape, and each of the drive sub-electrodes has a diamond-shaped grid shape.

13. A manufacturing method for a touch display panel, comprising:
performing a laser radiation on a cathode contained in the touch display panel to obtain a plurality of inductive electrodes and a plurality of drive electrodes intersecting with each other, each of the inductive electrodes comprises a plurality of inductive sub-electrodes connected in sequence, each of the drive electrodes comprises a plurality of drive sub-electrodes connected in sequence;
wherein before performing laser radiation on the cathode, the method further comprises:
forming an anode on a substrate;
depositing an organic light emitting layer on the anode;
performing a laser drilling on the organic light emitting layer to form a plurality of contact holes; and
depositing a cathode on the organic light emitting layer, and connecting the cathode to the anode at the contact holes.

14. The manufacturing method according to claim 13, wherein performing the laser drilling on the organic light emitting layer to form the contact holes comprises: predetermining positions where the contact holes to be formed according to an electrode pattern to be manufactured, and then penetrating the organic light emitting layer at the determined positions to form the contact holes at penetration positions by laser drilling.

15. The manufacturing method according to claim 13, wherein performing the laser radiation on the cathode contained in the touch display panel to obtain the plurality of inductive electrodes and the plurality of drive electrodes, comprising: performing the laser radiation on the cathode, every two contact holes are made in a group in a connecting direction of the inductive sub-electrodes, and the laser radiation is performed at two positions of a cathode portion between each group of contact holes; a cathode portion between the two positions is a drive sub-electrode, and the cathode portion between each group of contact holes is an inductive sub-electrode.

16. The manufacturing method according to claim 13, wherein performing the laser radiation on the cathode contained in the touch display panel to obtain the plurality of inductive electrodes and the plurality of drive electrodes, comprising: performing the laser radiation at one position of a cathode portion between each group of contact holes, every two contact holes are made in a group in a connecting direction of the drive sub-electrodes, and a cathode portion between two adjacent groups of contact holes is a drive sub-electrode.

17. The manufacturing method according to claim 13, wherein after depositing the cathode on the organic light emitting layer, the method further comprises:
    applying at the contact holes of the cathode a conductive material having a resistivity lower than that of the anode and the cathode.

18. The manufacturing method according to claim 17, further comprising printing silver paste at the contact holes of the cathode.

* * * * *